United States Patent [19]
Tanamoto et al.

[11] Patent Number: 5,710,436
[45] Date of Patent: Jan. 20, 1998

[54] QUANTUM EFFECT DEVICE

[75] Inventors: Tetsufumi Tanamoto, Kawasaki; Riichi Katoh, Yokohama; Li Zhang, Tokyo; Tadashi Sakai, Yokohama; Shigeki Takahashi, Kawasaki; Taketoshi Suzuki, Tokyo, all of Japan

[73] Assignee: Kabushiki Kaisha Toshiba, Kawasaki, Japan

[21] Appl. No.: 533,744

[22] Filed: Sep. 26, 1995

[30] Foreign Application Priority Data

Sep. 27, 1994 [JP] Japan .................................. 6-230837
Mar. 22, 1995 [JP] Japan .................................. 7-062234

[51] Int. Cl.⁶ .................... H01L 29/06; H01L 31/0328; H01L 31/0336; H01L 31/072
[52] U.S. Cl. ................ 257/14; 257/17; 257/22
[58] Field of Search ................ 257/14, 15, 17, 257/22, 28

[56] References Cited

U.S. PATENT DOCUMENTS 5,313,484  5/1994  Arimoto .................................. 372/46

OTHER PUBLICATIONS

Appl. Phys. Lett., vol. 62, No. 7 pp. 714–716, Feb. 15, 1993, Craig S. LENT, et al., "Bistable Saturation In Coupled Quantum Dots For Quantum Cellular Automata".

*Primary Examiner*—Sara W. Crane
*Assistant Examiner*—Douglas A. Wille
*Attorney, Agent, or Firm*—Oblon, Spivak, McClelland, Maier & Neustadt, P.C.

[57]  ABSTRACT

A quantum effect device includes a first layer having a plurality of charge confinement regions, a second layer opposing the first layer and separated from the first layer, the second layer having charges at a high concentration and consisting of a metal layer or a semiconductor layer, and a third layer consisting of an insulating layer or a semiconductor layer having a large band gap between the first layer and the second layer.

20 Claims, 11 Drawing Sheets

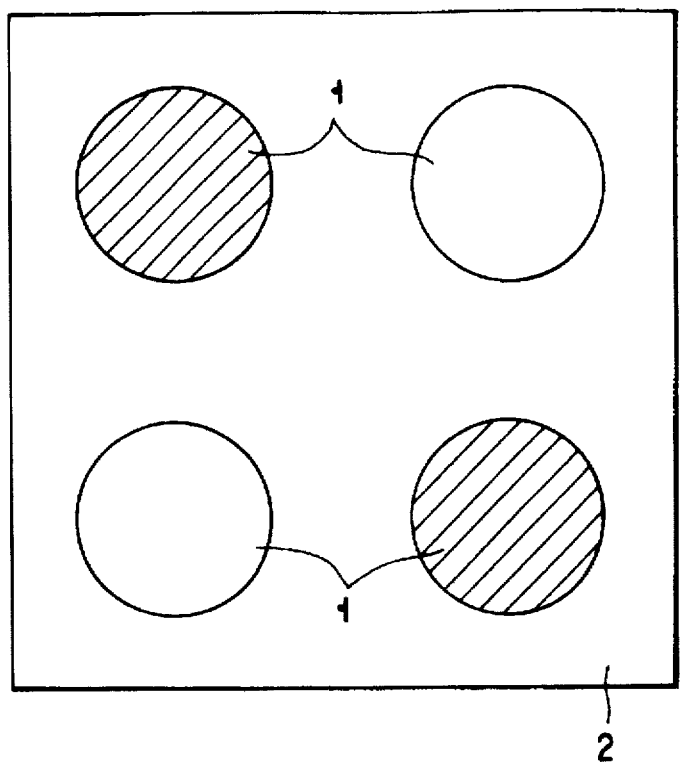
F I G. 1
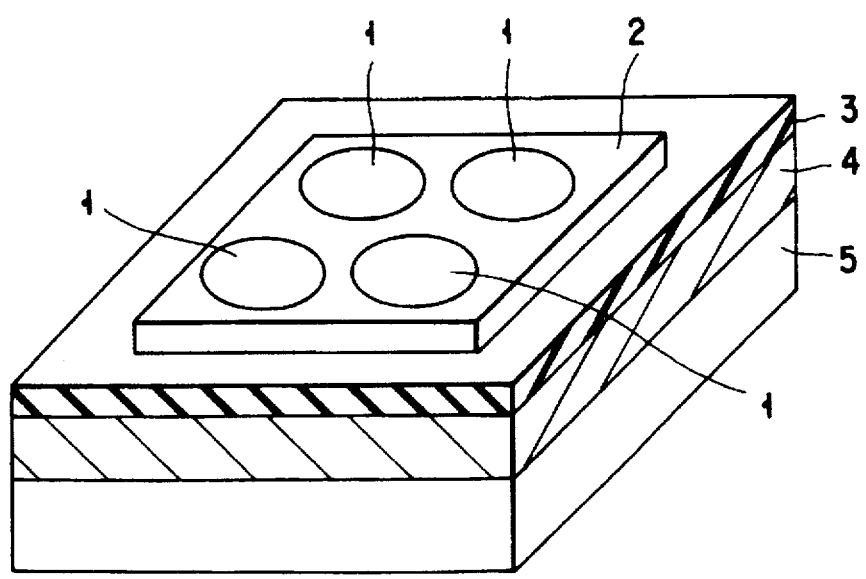
F I G. 2

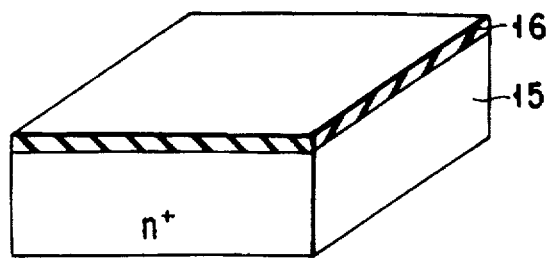
F I G. 8A
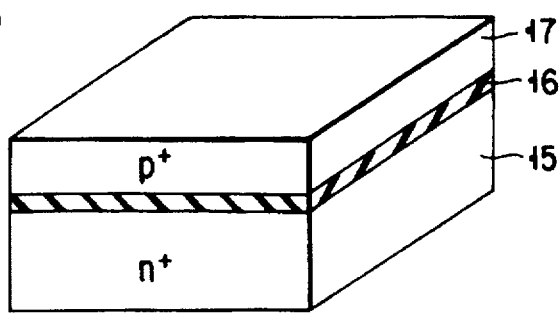
F I G. 8B
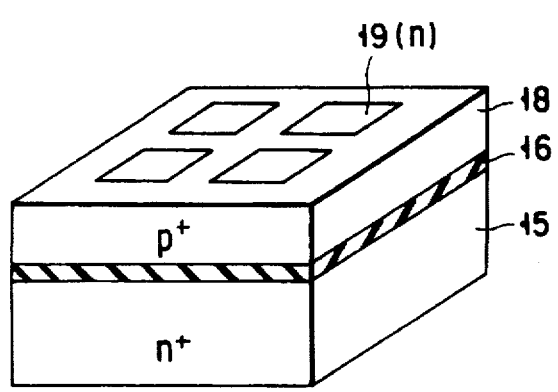
F I G. 8C
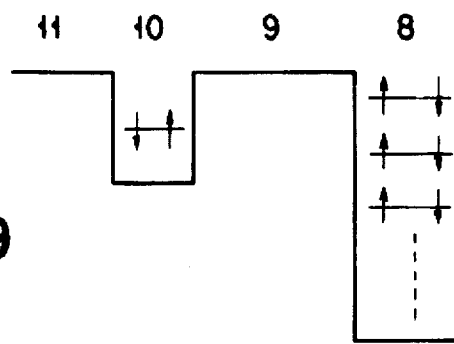
F I G. 9
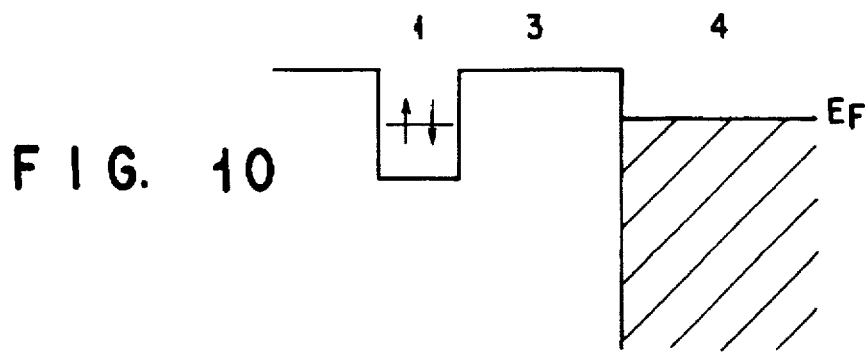
F I G. 10

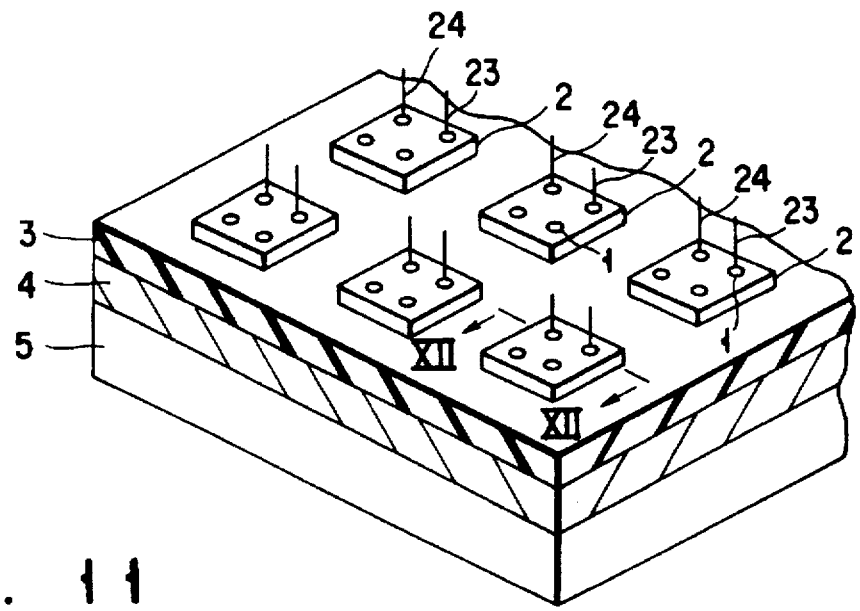
F I G. 11
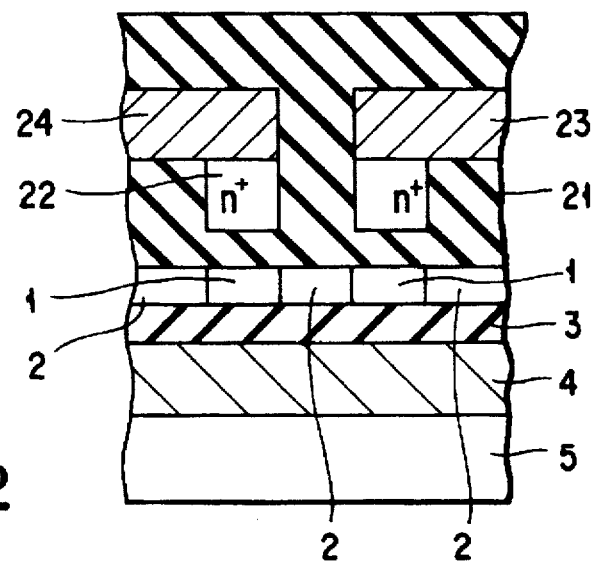
F I G. 12
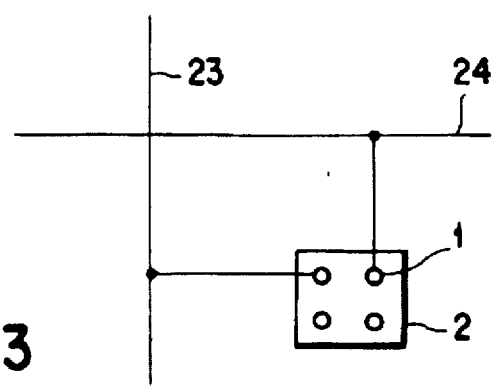
F I G. 13

QUANTUM EFFECT DEVICE

BACKGROUND OF THE INVENTION

1. Field of the Invention

The present invention relates to a quantum effect device and, more particularly, to a quantum effect device having a memory function.

2. Description of the Related Art

There is recently a growing interest in devices, i.e., so-called quantum effect devices which confine electrons in wires having a width of 100 nm or less, or dot regions, thereby controlling the movement of electrons in the one- or zero-dimensional regions. In such a quantum effect device, a microstructure with a size almost equal to the quantum-mechanical wavelength of electrons is formed on a semiconductor substrate to control the wave motion or the tunnel effect of electrons. With this structure, a high performance and multifunction beyond conventional devices are expected.

Along with an improvement in capacity and micropatterning of semiconductor memory devices, new memory structures which replace conventional DRAMs are required. As one of such memories, a structure using a QCA (Quantum Cellular Automata) is proposed. This memory operates in a region wherein the number of electrons contributing to the device operation is largely decreased as compared to a conventional DRAM (e.g., C. S. Lent et al., Quantum cellular automata; Nanotechnology, Vol. 4. pp. 49–57).

FIG. 1 is a plan view of the cell arrangement of a memory using the quantum effect. This memory is constituted by a cell 2 having four quantum dots 1. Two electrons are injected in the cell. When two electrons are injected in the cell, the electrons are distributed in the two quantum dots on a diagonal by the Coulomb force in accordance with the external electric field (one electron is present in each hatched quantum dot). Two states are attained at this time, i.e., a state wherein the electrons are present in the quantum dots on the diagonal up to the right, and a state wherein the electrons are present in the quantum dots on the diagonal up to the left. These two states are respectively defined as "0" and "1", thereby constituting a memory circuit.

Such a memory is premised on the operation in a region with a small number of electrons. This memory is suitable for micropatterning and high integration because of its characteristic features including a simple cell arrangement, and expected as a quantum effect memory device which might replace a DRAM.

However, the memory using the quantum effect proposed by Lent et al. has the following problems:

(1) With a cell size attainable by the conventional lithography technique, the energy difference between the ground state and the excited state, which define "0" and "1", is smaller than 1 meV. Such small energy difference disables stable maintenance of the states "0" and "1", so a room temperature operation of the element cannot be realized.

(2) To perform a room temperature operation, the size of a cell and the pattern of quantum dots must be controlled on the order of atomic level, resulting in a bulky manufacturing apparatus. Additionally, upon manufacture, a mask etching method suitable for mass production cannot be applied.

(3) Since the energy difference between the ground state and the excited state is small, as described above, an α-ray generated from U and Th contained in a package material, a high-energy electron beam or X-ray used in processes, or a high electric field formed in the device generates electrons and holes, which cause a so-called soft error. Therefore, a quantum effect memory device which actually operates at a room temperature has not been realized yet.

SUMMARY OF THE INVENTION

It is an object of the present invention to provide a quantum effect device which is hardly influenced by a thermal or electrical fluctuation and stably operates.

More specifically, it is an object of the present invention to provide a semiconductor memory device which prevents information from being volatilized even when a bias is not always applied.

In order to achieve the above object, according to the first aspect of the present invention, there is provided a quantum effect device comprising a first layer having a plurality of charge confinement regions, and a second layer opposing the first layer to be separated from each other and having charges at a high concentration.

The second layer is formed of a metal layer or a semiconductor layer having charges at a high concentration.

The charge confinement regions are formed of a first semiconductor, and the first layer and the second layer are separated from each other by a second semiconductor having a band gap larger than that of the first semiconductor, or a first insulator.

The memory using the quantum effect according to the present invention has the plurality of charge confinement regions as a cell unit, and has a band structure consisting of the charge confinement regions and a region surrounding these regions, so that two carriers are present in the cell, and three or more carriers cannot enter the cell.

A memory device using the quantum effect according to the present invention, comprises a substrate having movable charges, a first layer which is formed on the substrate, and in which movement of the charges is substantially suppressed, a plurality of cells formed in a matrix on the first layer, each of the plurality of cells having at least a first confinement region and a second confinement region, which are formed of a first semiconductor and assume different states in correspondence with a presence/absence of the charges, and being formed of a second layer, a plurality of bit lines formed on the plurality of cells in an insulative manner, and connected to the first confinement regions of the plurality of cells arranged in a column direction, and a plurality of word lines formed on the plurality of cells in an insulative manner, and connected to the second confinement regions of the plurality of cells arranged in a row direction.

When point charges are present above a layer (image charge layer) such as a metal or two dimensional electron gas layer having charges at a high concentration, the charges in the image charge layer are rearranged such that point charges having opposite polarity to that of the former point charges are present in the image charge layer. This phenomenon is observed in a substance (image charge layer) having a sufficient number of electrons for screening a local electrical gradient, and occurs when the majority of electrons in the image charges are arranged such that the lines of electric force of the point charges become perpendicular to the interface of the image charge layer as they enter the interface.

In the present invention, a plurality of charges are confined in a unit cell to form a polarized state. When this cell is arranged close to the image charge layer, the point charges in the cell are strongly coupled with the rearranged point charges having opposite polarity in the image charge layer. With this arrangement, a very stable polarized state can be realized.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a plan view showing a quantum dot cell so as to explain the principle of a semiconductor memory using quantum dots;

FIG. 2 is a perspective view of a quantum effect device according to the first embodiment of the present invention;

FIGS. 8A to 8C are perspective views showing steps in manufacturing a quantum effect device according to the fifth embodiment of the present invention;

FIG. 9 is an energy band diagram for explaining the energy states of the quantum dot and the image charge layer of the quantum effect device according to the second embodiment of the present invention;

FIG. 10 is an energy band diagram for explaining the energy states of the quantum dot and the image charge layer of the quantum effect device according to the first embodiment of the present invention;

FIG. 11 is a perspective diagram of a memory device using the quantum effect according to the sixth embodiment of the present invention;

FIG. 12 is a sectional view taken along a line XII—XII in FIG. 11;

FIG. 13 is a circuit diagram showing the relationship between a memory cell, a bit line, and a word line of the present invention;

DETAILED DESCRIPTION OF THE PREFERRED EMBODIMENTS

Figure 3:
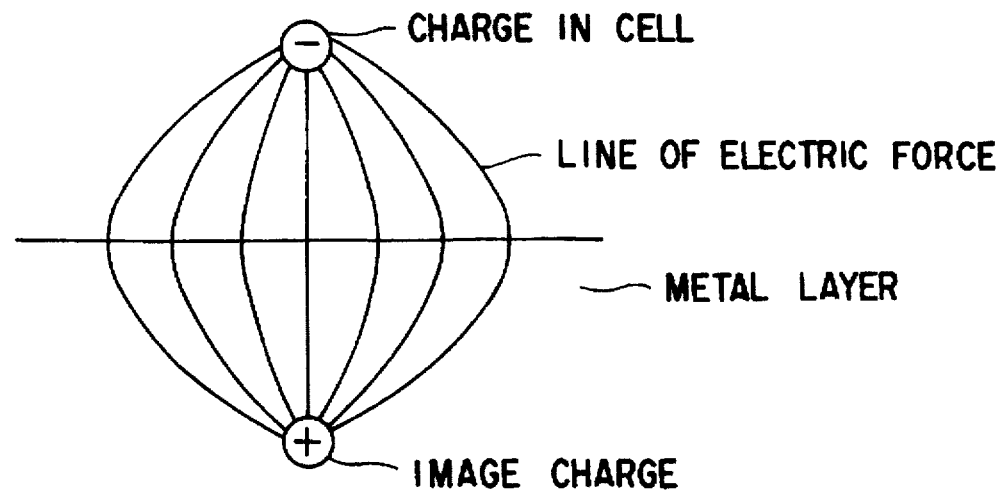
FIG. 3 is a view showing the lines of electric force generated between an image charge excited in an image charge layer, and an original charge.

The embodiments of the present invention will be described below in detail with reference to the accompanying drawings.

(First Embodiment)

FIG. 2 is a perspective view of a memory using the quantum effect according to the first embodiment of the present invention. In this embodiment, a cell 2 forming a memory is constituted by four quantum dots 1. A metal layer is used as an image charge layer 4 for stabilizing the two stable states. The cell 2 and the image charge layer 4 are insulated from each other by an insulating layer 3.

A method of manufacturing the memory of this embodiment will be described below.

A metal layer 4 consisting of Mo and having a thickness of 50 nm is formed on a GaAs substrate 5 by sputtering or deposition. An $SiO_2$ film as the insulating layer 3 is formed to a thickness of 20 nm by CVD. A cell 2 consisting of AlGaAs is formed on the SiO₂ insulating layer 3, and four quantum dots 1 consisting of GaAs are formed in the cell 2.

When a largecarrier supply layer, i.e., the metal layer 4 is formed, and the size of a quantum dot and the thickness of the insulating layer 3 are controlled, electrons are supplied from the metal layer 4 into the cell 2 to cause a polarized state.

The quantum dots in each cell must have only one energy level. The nth energy level of the quantum dots is determined by a size L of the quantum dot. The energy level at this time can be approximately represented by the following equation:

$$E_n = (h/2\pi)^2 \pi^2 n^2 / (2 mL^2) \tag{1}$$

where h is the Plank's constant, and m is the mass of electrons.

With size reduction of the quantum dot, the interval between the energy levels in the quantum dot can be increased. At this time, the energy discontinuity (energy difference) in the conduction band of the semiconductor between the inside of the quantum dot and the outside of the quantum dot must be designed so that the second energy level in the quantum dot becomes larger than this energy discontinuity. With this design, two electrons can be supplied from the metal layer 4 into the quantum dot system through the insulating layer 3. No excess electron can enter the cell 2 because of the high energy level.

With the above arrangement, a polarized state occurs in the cell 2. An image charge corresponding to the charge in the cell is generated in the metal layer 4 to stabilize the polarized state in the cell. FIG. 3 is a view showing a state wherein an image charge (a positive charge in this case) corresponding to a charge (a negative charge in this case) in the cell is induced in the metal layer.

Figure 4:
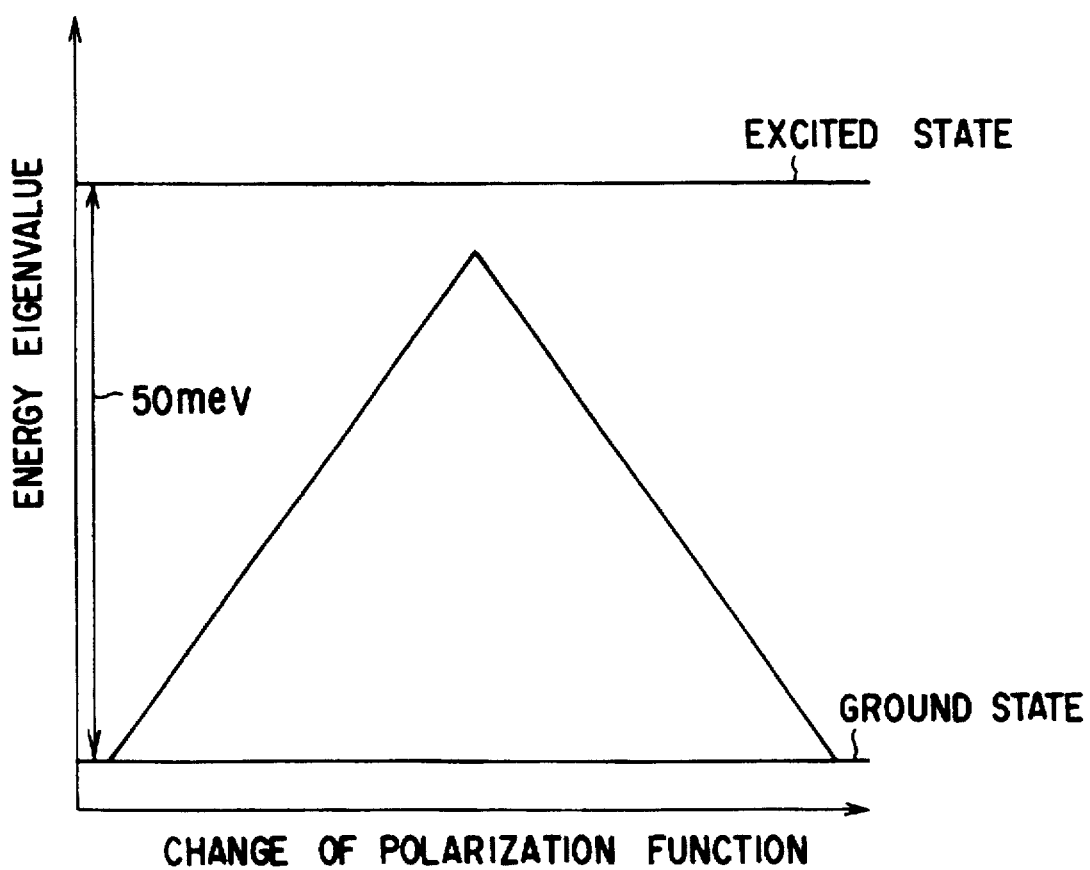
FIG. 4 is a graph showing a change in energy of the cell of the quantum effect device of the present invention.

FIG. 4 is a graph schematically showing a change in eigenvalue which characterizes the two stable states of the memory manufactured in the above manner. As shown in FIG. 4, the energy state of electrons confined in the quantum dots exhibits discontinuous values due to the quantum effect. The energy difference between the ground state and the excited state is about 50 meV when the diameter of the quantum dot is about 50 nm. This value can be converted to a temperature more than room temperature, so that a room temperature operation can be easily performed.

Although not illustrated, in the quantum effect memory proposed by Lent et al., the energy difference between the ground state and the excited state is only 0.5 meV. When this value is converted to a temperature, the absolute temperature becomes 5K, so this quantum effect memory cannot be operated at room temperature.

As described above, according to the present invention, the cell portion for performing a memory operation is formed on, e.g., a metal or heavily doped semiconductor layer with high-concentration charges for causing an image charge phenomenon, through an insulating layer. With this arrangement, a very stable polarized state can be obtained to realize a quantum effect memory operable at room temperature.

(Second Embodiment)

Figure 5:
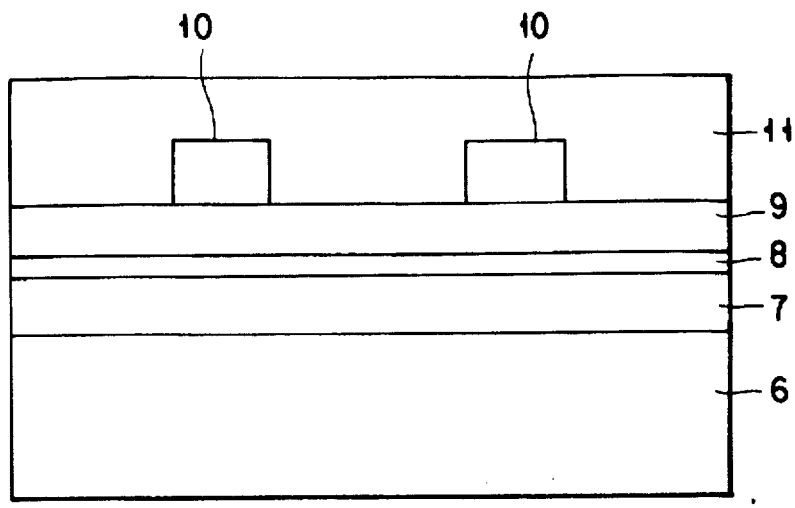
FIG. 5 is a sectional view of a quantum effect device according to the second embodiment of the present invention.

FIG. 5 is a sectional view of a memory using the quantum effect according to the second embodiment of the present invention.

The memory of this embodiment has, as an image layer, a two dimensional electron gas layer 8 for receiving electrons from a uniformly doped layer 6. Quantum dots 10 are formed on the two dimensional electron gas layer 8 through a semiconductor layer 9 having a larger band gap than that of a semiconductor constituting quantum dots 10.

A method of manufacturing the memory according to this embodiment will be described below.

An i-type AlGaAs spacer layer 7, a memory charge layer 8 consisting of i-type GaAs or i-type InGaAs, and an i-type AlGaAs semiconductor layer 9 (semiconductor layer having a large band gap) are formed by MBE on a semiconductor substrate 6 consisting of n-type AlGaAs or n-type InP. A GaAs layer to be converted to quantum dots 10 later is formed on the surface of the resultant structure.

The GaAs layer formed on the uppermost layer is patterned by photolithography to form quantum dots 10. An AlGaAs semiconductor layer 11 having a large band gap is formed on the resultant structure by MBE, thereby completing the memory device of the present invention.

The combination of the quantum dots 10/semiconductor layer 11 in the cell may be such as InGaAs/AlInAs, InGaAs/InP, InGaAs/GaInSb, or small band gap semiconductor/large band gap semiconductor, in addition to GaAs/AlGaAs.

(Third Embodiment)

Figure 6:
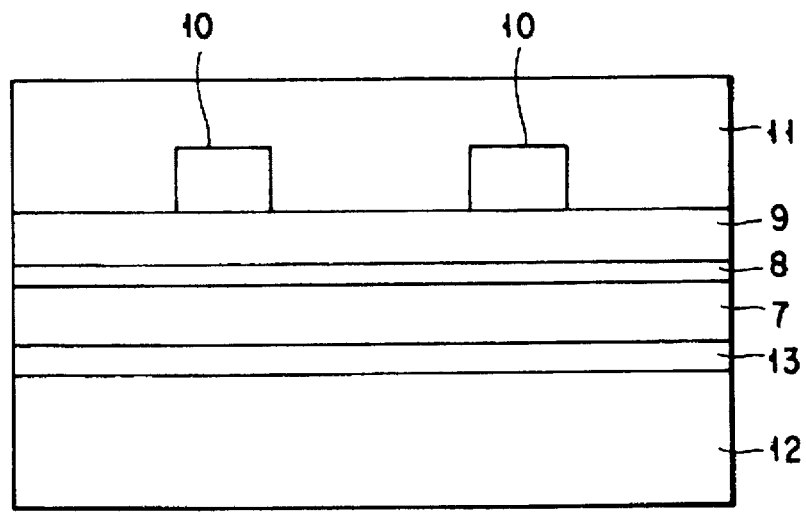
FIG. 6 is a sectional view of a quantum effect device according to the third embodiment of the present invention.

FIG. 6 is a sectional view of a memory using the quantum effect according to the third embodiment of the present invention.

In this embodiment, a two dimensional electron gas layer 8 for receiving electrons from a planar doped layer 13 is used as an image charge layer, and quantum dots 10 are formed on the two dimensional electron gas layer 8 through a semiconductor layer 9 having a larger band gap than that of a semiconductor constituting quantum dots 10.

A method of manufacturing the memory according to this embodiment will be described below.

The surface of a substrate 12 consisting of i-type AlGaAs is planar-doped with Si to form a planar doped layer 13. An i-type AlGaAs spacer layer 7, a memory charge layer 8 consisting of i-type InGaAs, and an i-type AlGaAs semiconductor layer 9 (semiconductor layer having a large band gap) are formed by MBE on the substrate 12 having the planar doped layer 13 thereon. A GaAs layer to be converted to quantum dots 10 later is formed on the resultant structure.

The GaAs layer formed on the uppermost layer is patterned by photolithography to form quantum dots 10. An AlGaAs semiconductor layer 11 is formed on the resultant structure by MBE, thereby completing the memory device of the present invention.

The combination of the quantum dots 10/semiconductor layer 11 in the cell may be InGaAs/AlInAs, InGaAs/InP, InGaAs/GaInSb, or the like, in addition to GaAs/AlGaAs.

(Fourth Embodiment)

Figure 7:
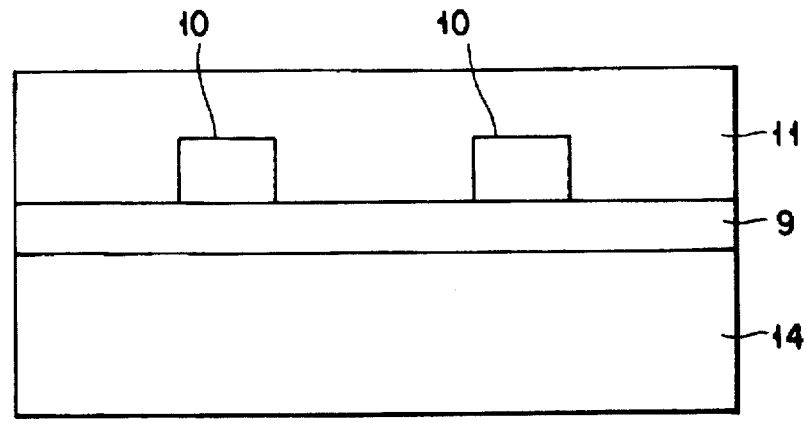
FIG. 7 is a sectional view of a quantum effect device according to the fourth embodiment of the present invention.

FIG. 7 is a sectional view of a memory using the quantum effect according to the fourth embodiment of the present invention.

The memory of this embodiment has an n⁺layer 14 as an image charge layer, and quantum dots 10 formed on the n⁺ layer 14 via a semiconductor layer 9 having a larger band gap than that of a seimconductor constituting quantum dots 10.

A method of manufacturing the memory according to this embodiment will be described below.

An i-type AlGaAs semiconductor layer 9 (semiconductor layer having a large band gap) is formed on an n⁺-type GaAs semiconductor substrate 14 by MBE. A GaAs layer to be converted to quantum dots 10 later is formed on the resultant structure. The GaAs layer formed on the uppermost layer is patterned by photolithography to form quantum dots 10. An AlGaAs semiconductor layer 11 is formed on the resultant structure by MBE, thereby completing the memory of the present invention.

In this embodiment, the n$^+$ GaAs layer 14 functions as an image charge layer. An n$^+$ Si layer can also be used as the image charge layer 14 while the layer 9 can be formed of SiO$_2$. A p$^+$ layer may be used as an image charge layer in place of the n$^+$ layer.

The combination of the quantum dots 10/semiconductor layer 11 may be InGaAs/AlInAs, InGaAs/InP, InGaAs/GaInSb, or the like, in addition to GaAs/AlGaAs.

(Fifth Embodiment)

FIGS. 8A to 8C are perspective views showing a method of manufacturing a memory using the quantum effect according to the fifth embodiment of the present invention.

The memory of this embodiment has an n$^+$ silicon layer 15 as an image charge layer, and quantum dots 19 in a porous silicon oxide film 18 formed on the n$^+$ layer 15 via an SiO$_2$ insulating layer 16.

A method of manufacturing the memory according to this embodiment will be described below. As shown in FIG. 8A, the surface of the n$^+$ silicon substrate 15 is oxidized to form a silicon oxide film 16. As shown in FIG. 8B, a silicon layer is epitaxially grown on the oxide film 16 and doped with boron to form a p$^+$ silicon layer 17.

By FIB (Focused Ion Beam), the p$^+$ silicon layer 17 is doped with phosphorus (P) at a high concentration (10$^{20}$ cm$^{-3}$) at a low energy of 20 KeV or less. With this process, fine n$^+$ regions (quantum dots) (not shown) where electrons are locally present are formed in the p$^+$ silicon layer 17.

Light of a halogen lamp is irradiated on the substrate in a hydrofluoric acid solution to perform anodic forming. With this process, the p$^+$ silicon layer 17 is etched and converted into a porous silicon layer having a large band gap. At this time, the n$^+$ regions become quantum dots without being etched.

Only the p$^+$ silicon layer 17 is oxidized using the difference in oxidation rate, thereby forming a porous silicon oxide film 18. With this process, the memory of the present invention, which has the quantum dots 19 formed in the porous silicon oxide film 18 and the image charge layer 15 formed via the insulating film 16 is completed (FIG. 8C).

The relationship between the potentials of the memory of the present invention will be described below with reference to the energy band diagram. FIG. 9 is an energy band diagram observed when both the cell having quantum dots and the image charge layer are formed of semiconductors (corresponding to FIG. 6). The corresponding reference numerals in FIG. 5 are added to the upper portion of FIG. 9. Arrows in wells represent the spins of electrons.

FIG. 10 is an energy band diagram observed when the cell having quantum dots is formed of a semiconductor, and the image charge layer is formed of a metal (corresponding to FIG. 2). When the cell is formed of a semiconductor, the quantum dot portions can be formed using a semiconductor having a small band gap while the peripheral portion can be formed of a semiconductor having a band gap larger than that of the quantum dot portions. For example, GaAs can be used for the quantum dots, and GaAlAs can be used for the peripheral portion. Isolation between cells can be realized using a semiconductor having a further larger band gap or an insulating layer.

As the combination of the material systems of the quantum dots and the peripheral portion in a cell, InGaAs/AlGaAs, SiGe/Si, InPb/InAs, Si/SiO$_2$, or Al/Al$_2$O$_3$ is available. Such material system can also be used as the substance system of an interface as an image charge layer for generating a two dimensional gas.

As a metal forming the image charge layer, W, CaF, TiN, Al, Au, Pt, Si, or the like can be used. The screening length due to the charge in the substance used as the image charge layer is expressed as $(6\pi e^2 n/EF)^{1/2}$ in accordance with Thomas-Fermi approximation, where n is the electron concentration, and EF is the Fermi energy. It suffices to use a substance system with a screening length smaller than the size of a region for confining the charge in the cell.

The diameter of a quantum dot is limited by the screening length of the substance system of the image charge layer. If the diameter of the quantum dot is larger than the screening length, an mirror image of the diameter of the quantum dot which is a region where charges are accumulated in the quantum dot system clearly appears in the image charge layer. More specifically, when the screening length is sufficiently decreased, the charges in the image charge layer can easily move. The screening length of GaAs at an electron density of 10$^{18}$/cm$^3$ is about 1 nm.

(Sixth Embodiment)

FIG. 11 is a perspective diagram of a memory device using the quantum effect according to the sixth embodiment of the present invention.

In this embodiment, a plurality of cells described in the first embodiment are arranged in a matrix at an interval almost equal to the size of a cell, and a word line and a bit line are connected to each cell, thereby completing a highly integrated practical memory device.

A metal layer 4 serving as an image charge layer is formed on a substrate 5. A plurality of memory cells are formed on the metal layer 4 via an insulating layer 3. A bit line 23 and a word line 24, both of which are formed of an Al wire, are respectively connected to two adjacent quantum dots in a memory cell.

FIG. 12 is a sectional view taken along a line XII—XII in FIG. 11. An insulating interlayer 21 is formed on a cell 2 having quantum dots 1. Semi-conductor layers heavily doped with an impurity, e.g., n$^+$ silicon layers 22 are formed above the quantum dots 1 with the insulating interlayer 21 interposed there-between. The n$^+$ Si layers 22 are connected to the bit line 23 and the word line 24. The bit line 23 and the word line 24 serve as electrodes for writing/reading information in/from the quantum dots in the cell.

The electrodes forming the bit line 23 and the word line 24 are arranged to be close to the dots 1 in the cell through the insulating interlayer 21. These electrodes have a function of providing the effect of an electric field in the cell and are not directly connected to the dots 1.

These electrodes are in contact with the heavily doped semiconductor layers 22. With this arrangement, the quantum cells can be prevented from being directly influenced by a current flowing through the bit and word lines.

FIG. 13 is a circuit diagram showing the relationship between the bit line 23, the word line 24, and the memory cell 2. A read access to this memory device is performed by reading the polarization direction in the cell 2 from the potential values of the word line 24 and the bit line 23. A write access is enabled when an external potential applied to the word line 24 and an external potential applied to the bit line 23 are adjusted to change the potential to be applied to a cell whose polarized state is to be changed.

In the above embodiments, a four-quantum-dot cell containing four quantum dots in a cell has been described. However, the present invention is not limited to the four quantum dots and can also be applied to a cell containing two, three, five, or six or more quantum dots.

The number of electrons confined in a cell is not limited to two, and two or more electrons can also be confined. This is because, in the present invention, a polarized state is caused by an image charge to realize a very stable ground state.

As described above, according to the present invention, the quantum dots are formed at an interval on the charge layer having a high concentration, thereby inducing an image charge with a sign opposite to the charge in the quantum dot. A strong electrical coupling occurs due to the Coulomb interaction between the charges. Therefore, a very stable polarized state free from a thermal or electrical fluctuation at room temperature can be realized. A semiconductor memory device employing the above characteristic features can be realized at the quantum level.

The embodiments of a method of manufacturing quantum dots used in the above memory device will be described in more detail.

(Seventh Embodiment)

Figure 14A:
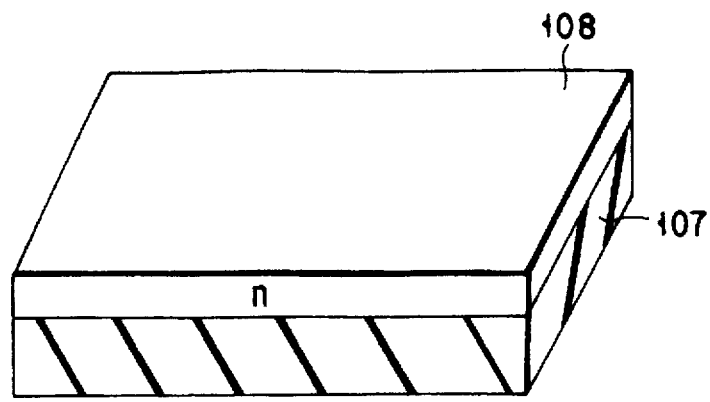
FIGS. 14A to 14C are perspective views of a quantum effect device, which show a method of manufacturing a quantum dot array according to the seventh embodiment of the present invention.
Figure 14B:
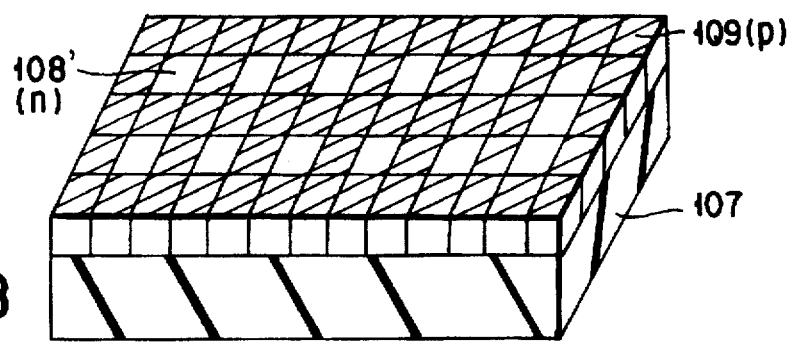
Figure 14C:
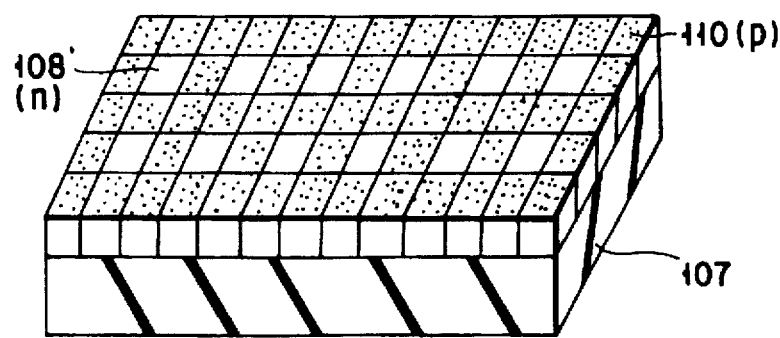

FIGS. 14A to 14C are perspective views showing a process of manufacturing a quantum dot array according to the seventh embodiment of the present invention. The process of manufacturing quantum dots will be described below with reference to FIGS. 14A to 14C.

As shown in FIG. 14A, an n-type thin silicon film 108 having a thickness of 10 nm is deposited on an $SiO_2$ substrate 107 by CVD using $SiH_2Cl_2$ gas (substrate temperature: 300° C.).

As shown in FIG. 14B, boron (B) is selectively ion-implanted by FIB to form a p-type matrix wire pattern 109 (hatched portion). At the same time, n-type dots 108' are formed. In FIB, a micropattern can be formed because a high-luminance ion beam can be very precisely focused. However, since the ion energy is normally high (20 to 100 KeV), damage to the substrate has conventionally posed a problem. FIB of this embodiment uses conditions such as a beam acceleration voltage of 20 KeV, and a beam diameter of 10 nm. Since the ion energy is relatively low, damage to the substrate can be prevented. At this time, the interval between each side of the n-type dot 108' and the adjacent n-type dot 108' is 10 nm.

As shown in FIG. 14C, anodic forming is performed to selectively convert the p-type region 109 to a porous layer, thereby forming a porous silicon layer 110 (dotted portion) having a large band gap. For anodic forming, optical forming is performed by immersing the sample in a solution of hydrofluoric acid (HF: $C_2H_5OH$=2:3) and irradiating light of a Xe lamp (intensity: 1 mW).

In this manner, a quantum dot array having the porous silicon layer 110 serving as a quantum potential barrier formed for the n-type silicon regions 108' is formed. In a conventional quantum potential barrier by a p-n junction, the barrier height undesirably becomes low and moderate. However, in the present invention, a potential barrier layer consisting of a porous silicon layer is used, so that a steep barrier can be obtained.

In this case, the $SiO_2$ substrate is used. However, an SOI substrate may also be used.

(Eighth Embodiment)

In this embodiment, the element structure shown in FIG. 14C, which has been described in the seventh embodiment, is further thermally oxidized, thereby forming quantum dots.

Figure 15:
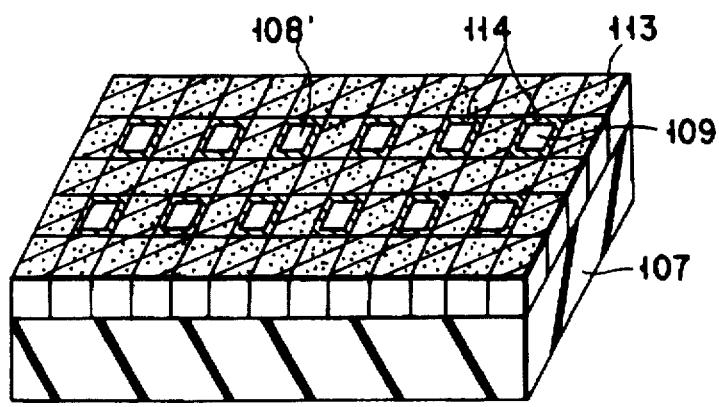
FIG. 15 is a perspective view of a quantum dot array according to the eighth embodiment of the present invention.

The substrate shown in FIG. 14C is thermally oxidized using a gas mixture of $O_2$ and $N_2$ ($O_2$: 11 ml/min, $N_2$: 50 ml/min, 900° C., 10 minutes). With this process, as shown in FIG. 15, the porous silicon layer is selectively oxidized to form a porous silicon oxide layer 113. At the same time, a very thin crystalline silicon oxide film 114 is formed at the interface between the n-type silicon layer and the porous oxide film. The crystalline silicon oxide film 114 is obtained upon partial oxidation of an n-type silicon layer 108' and has a precise and stable structure. A potential barrier layer formed from this structure becomes more ideal. In this manner, by changing the material of the potential barrier layer by oxidation, quantum dots having a double barrier structure of the quantum dot 108' consisting of n-type silicon, the barrier layer 114 formed of a silicon oxide film, and the barrier layer 113 formed of a porous silicon oxide film can be formed in a surface.

Therefore, the interface characteristics can be improved by $SiO_2$, and trap and the like of carriers can be prevented, so that stable element characteristics can be expected. A quantum dot substrate formed by this method is suitable for application to a device such as a silicon ULSI because of the flat structure which facilitates post-processing including formation of an insulating film or electrodes.

In addition, the thickness of the crystalline silicon oxide film 114 can be freely controlled in accordance with the thermal oxidation time. For this reason, a quantum effect device having a desired energy level can be provided. Furthermore, a quantum wire can be made further thinner by adjusting the oxidation time. For this reason, a very fine structure unavailable by a mask process or a normal ion doping process can be formed.

(Ninth Embodiment)

Figure 16A:
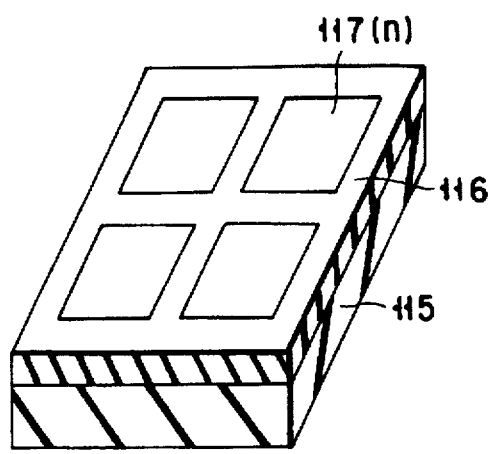
FIGS. 16A to 16C are perspective view of a quantum effect device, which show a method of manufacturing a quantum dot array according to the ninth embodiment of the present invention.
Figure 16B:
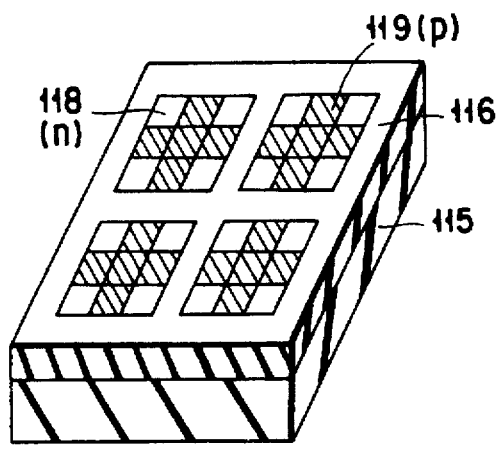
Figure 16C:
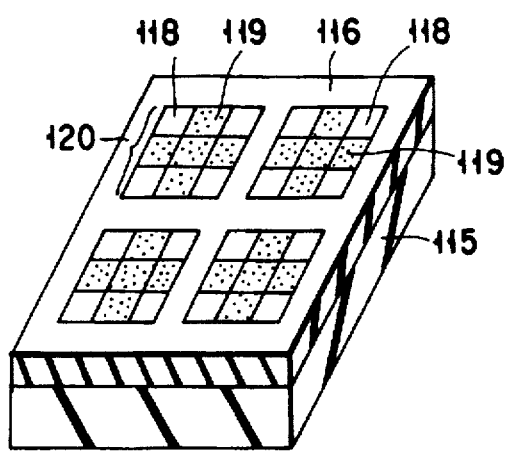

FIGS. 16A to 16C are perspective views showing a method of manufacturing a quantum effect device according to the ninth embodiment of the present invention. This embodiment relates to a quantum dot surrounded by potential barrier layers having different levels.

As shown in FIG. 16A, an n-type monocrystalline silicon layer having a thickness of about 10 nm is formed by CVD on an $SiO_2$ substrate 115 whose surface is oxidized and insulated. As the CVD conditions at this time, $SiH_2Cl_2$ gas is used, and the substrate temperature is set at 300° C.

The surface of the substrate 115 is oxidized using a mask, thereby forming n-type silicon regions 117 and a silicon oxide film 116 on the substrate 115. As the oxidation conditions, the substrate temperature is 1,000° C., the flow rates of $N_2$ and $O_2$ are 50 ml/min and 11 ml/min, and the process time is five hours. An SOI substrate can also be used as the substrate 115.

As shown in FIG. 16B, the n-type silicon regions 117 are doped with a p-type impurity (B) by FIB to form n-type quantum dots 118 and p-type regions 119 (hatched portions). At this time, the beam acceleration voltage is 20 KeV, and the beam diameter is 10 nm.

As shown in FIG. 16C, anodic forming is performed to selectively convert the p-type regions 117 to porous layers, thereby forming porous silicon layers 119' (dotted portions). For anodic forming, optical forming is performed by immersing the sample in a solution of hydrofluoric acid (HF: $C_2H_5OH=2:3$) and irradiating light of a Xe lamp (intensity: 1 mW).

In this manner, a quantum dot structure in which the n-type quantum dot region 118 is surrounded by the barrier layer 119 formed of a porous silicon film and the barrier layer 116 formed of a silicon oxide film having a band gap larger than that of the porous silicon film is formed.

In FIG. 16C, a portion 120 where the four quantum dots 118 are surrounded by the silicon oxide layer is defined as a cell unit. In this case, the adjacent quantum dots 118 in the cell 120 are separated from each other by the relatively low potential barrier layer 119 consisting of porous silicon. For this reason, electrons can move between the adjacent quantum dots by the tunnel effect. However, the cells are separated from each other by the relatively high potential barrier layer 116 consisting of silicon oxide. Therefore, no tunnel effect occurs, so the electrons cannot move between the cells.

Although movement of electrons by the tunnel effect is not observed between the cells, the electrons influence each other by the Coulomb interaction. When potential barrier layers having different levels are formed on the substrate, a quantum effect device called a QIC (Quantum Interconnections with Cellular architecture) can be formed.

Figure 17:
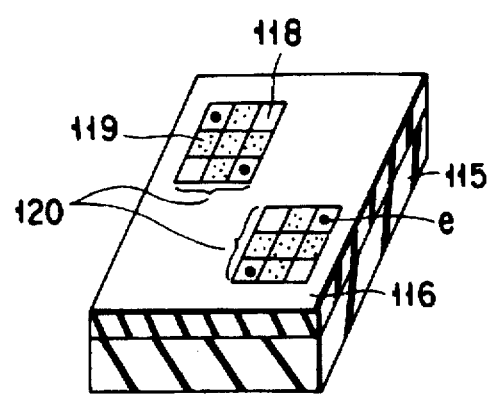
FIGS. 17 to 19 are perspective views of quantum dot arrays as modifications of the ninth embodiment.
Figure 18:
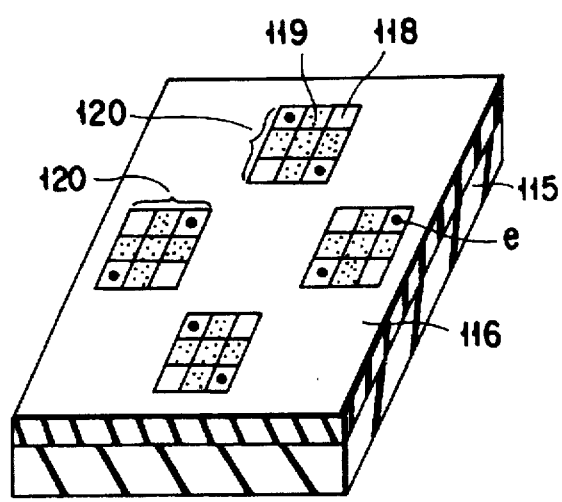
Figure 19:
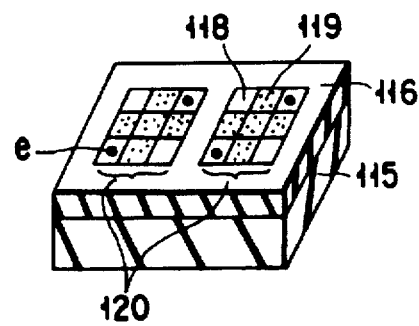

With the same process as in this embodiment, an element structure with a different arrangement of the cells 120 can be formed, as shown in FIGS. 17 to 19. The same reference numerals as in FIGS. 16A to 16C denote the same portions in FIGS. 17 to 19, and a detailed description thereof will be omitted.

When cells with this arrangement are doped with electrons, the electrons are localized at positions indicated by full dots e. By combining these arrangements, quantum wires or a logic circuit can be formed.

When the manufacturing methods described in the above seventh to ninth embodiments are applied, quantum wires can be formed. An example will be described below.

(10th Embodiment)

Figure 20A:
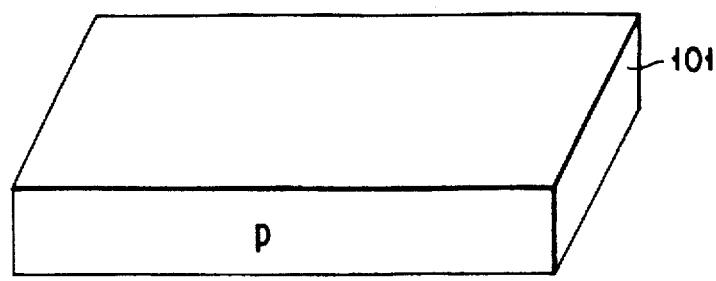
FIGS. 20A to 20C are perspective views showing the method of manufacturing quantum wires according to the 10th embodiment of the present invention.
Figure 20B:
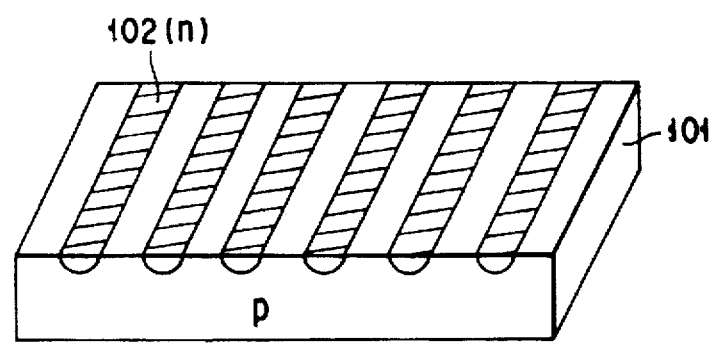
Figure 20C:
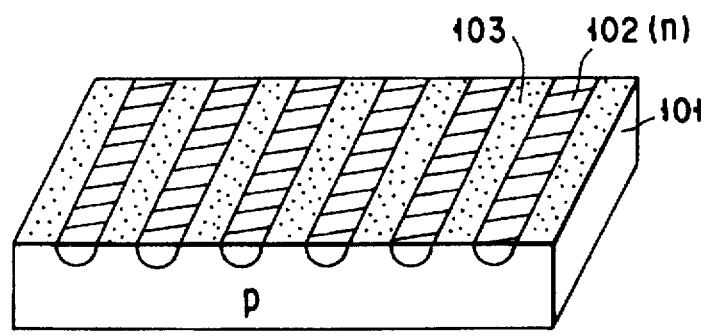

FIGS. 20A to 20C are perspective views showing a process of manufacturing a quantum wire array using a porous silicon layer as a potential barrier according to the 10th embodiment of the present invention.

As shown in FIG. 20A, a p-type silicon substrate (volume resistivity: 10 cm·Ω) 101 whose surface is treated by standard cleaning (RCA cleaning) for a normal semiconductor wafer is prepared.

As shown in FIG. 20B, FIB ion implantation at a low energy of 20 KeV or less is performed to dope the substrate with phosphorus (P) as an impurity at a high concentration ($10^{20}$ cm$^{-3}$), thereby forming n-type wires 102 in the p-type silicon substrate 101. The diameter of the beam in FIB is several nm, and the width of the formed n-type wire 102 is about 10 nm. The interval between the wires can be freely changed as needed.

Finally, as shown in FIG. 20C, optical forming is performed by immersing the sample in a solution of hydrofluoric acid (HF: $C_2H_5OH=2:3$) and irradiating Xe lamp light (intensity: 1 mW).

Figure 21:
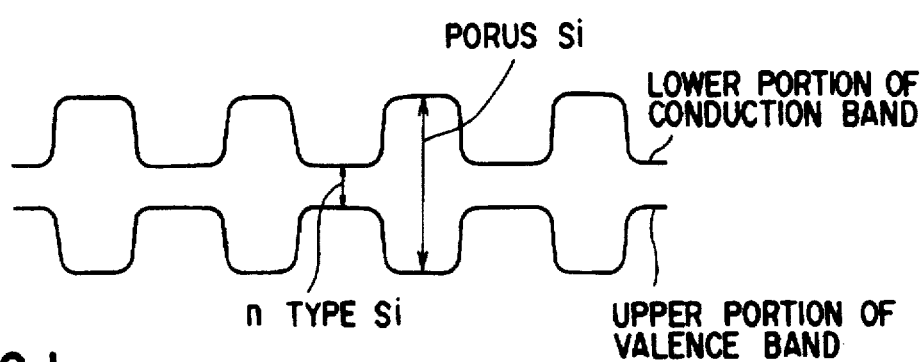
FIG. 21 is an energy band diagram of a surface superlattice according to the 10th embodiment of the present invention.

In this manner, the p-type silicon substrate 101 is selectively etched by an anode, and the etched portions are converted to porous silicon layers 103 (dotted portions) having a large band gap (FIG. 20C). At this time, the n-type wires 102 become quantum wires without being etched, and the porous silicon layers 103 become quantum confinement barrier layers (quantum potential barrier). When the p-type silicon substrate 101 is sufficiently thin, i.e., when the interval between the n-type wires 102 is sufficiently small, a surface superlattice structure having an energy band as shown in FIG. 21 is formed.

According to the 10th embodiment, a quantum wire array with a good line width controllability can be realized without using processes including transfer, exposure, and development of a pattern. In addition, since porous silicon layers having very low potential barrier layers are formed, a surface superlattice structure characterized by interaction between the quantum wires can be realized. Since the porous silicon layers 103 are used as quantum potential barrier layers, a steep potential barrier is formed at the interface with the n-type wire 102.

In this embodiment, the energy in FIB is low, so damage to the substrate can be minimized, and a satisfactory quantum effect can be expected.

(11th Embodiment)

Figure 22A:
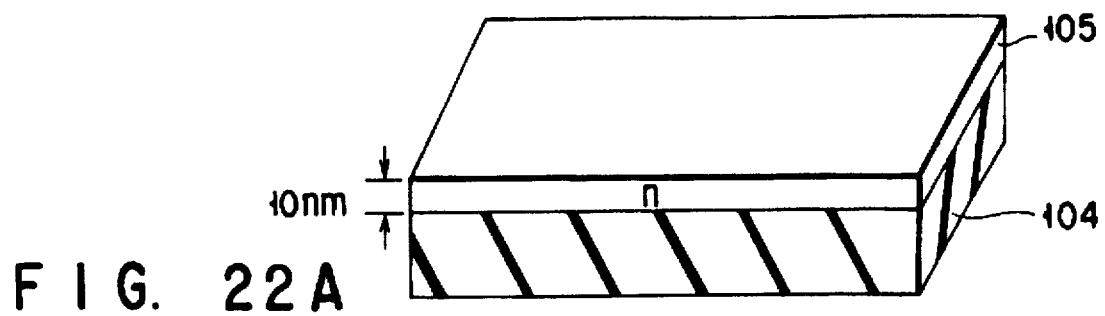
FIGS. 22A to 22C are perspective views of a quantum effect device, which show a method of manufacturing quantum wires according to the 11th embodiment of the present invention.
Figure 22B:
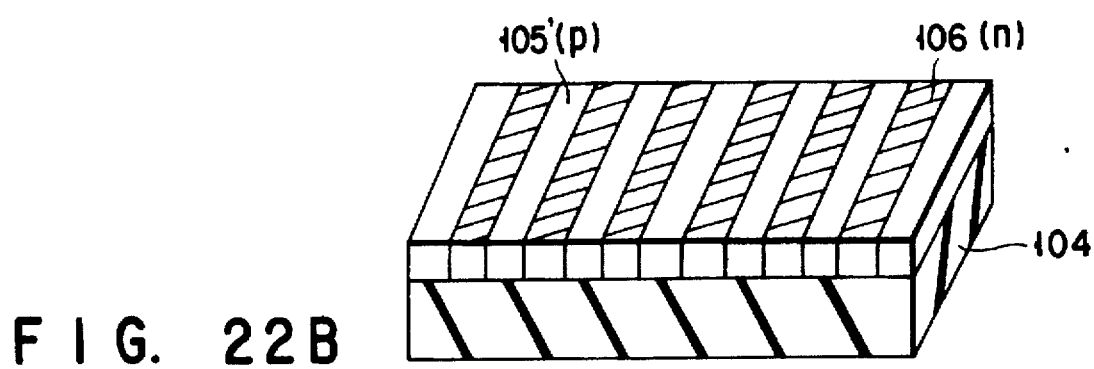
Figure 22C:
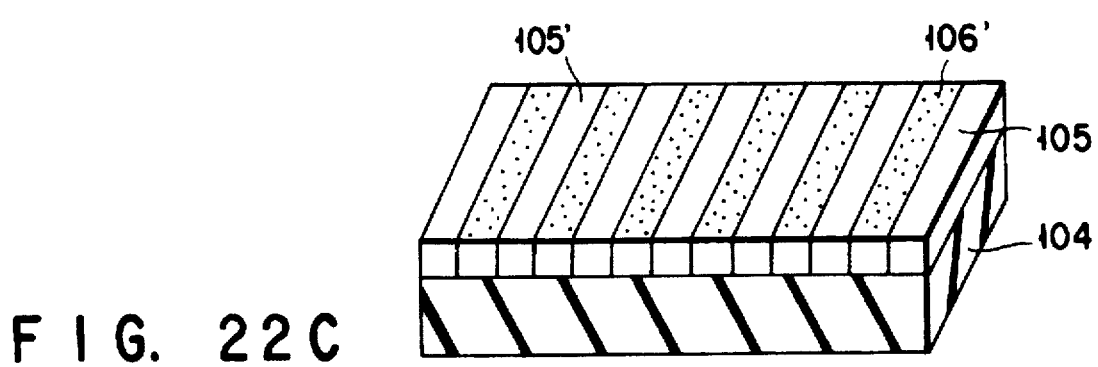

FIGS. 22A to 22C are perspective views showing a process of manufacturing a quantum wire array according to the 11th embodiment of the present invention. In this embodiment, quantum wires are formed as in the 10th embodiment. However, as a substrate, an insulating substrate having a semiconductor film formed thereon is used.

As shown in FIG. 22A, an n-type monocrystalline silicon layer 105 having a thickness of about 10 nm is formed on an insulating $Al_2O_3$ substrate 104 by CVD. As the CVD conditions, $SiH_2Cl_2$ gas is used, and the substrate temperature is set at 300° C.

Subsequently, as shown in FIG. 22B, the n-type monocrystalline silicon layer 105 is selectively doped with boron (B) by FIB ion implantation to form a plurality of p-type wires 105'. As the doping conditions, the beam acceleration voltage is 20 KeV, and the diameter of the beam is 10 nm. As a result, a plurality of n-type wires 106 are formed between the plurality of p-type wires 105'.

At this time, ion implantation is performed such that both the width of the p-type wire 105' and the width of the n-type wire 106 become 10 nm.

As shown in FIG. 22C, the n-type wires 106 are selectively converted to porous layers under the same conditions as in the 10th embodiment to form porous silicon layers 106' (dotted portions) having a large band gap. With this process, a quantum wire array in which the p-type silicon quantum wires 105' are sandwiched between barrier layers formed of the n-type porous silicon layers 106' can be obtained. For the quantum wires formed in this manner, control in the direction of thickness can be performed by CVD. Therefore, together with the controllability in the planer direction of the present invention, three-dimensional control can be conveniently performed.

(12th Embodiment)

Figure 23:
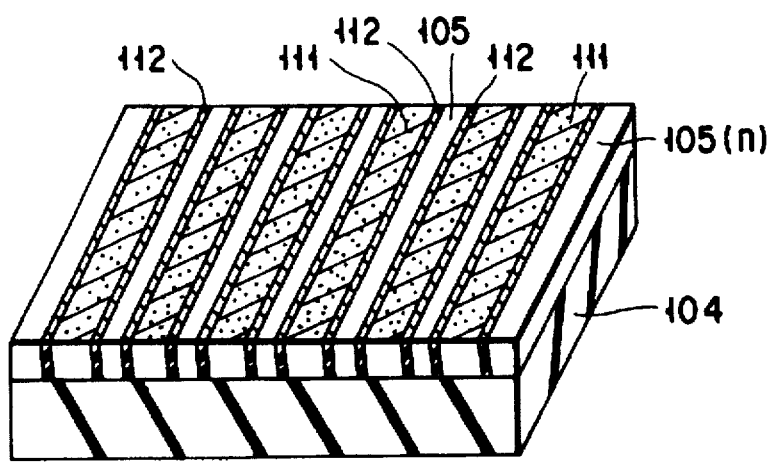
FIG. 23 is a perspective view of quantum wires according to the 12th embodiment of the present invention.

FIG. 23 is a perspective view of a quantum effect device according to the 12th embodiment of the present invention. In this embodiment, the element structure shown in FIG. 22C, which has been described in the 11th embodiment, is further thermally oxidized to form quantum wires.

The substrate shown in FIG. 22C is thermally oxidized using a gas mixture of $O_2$ and $N_2$ ($O_2$: 11 ml/min, $N_2$: 50 ml/min, 900° C., ten minutes). With this process, as shown in FIG. 22, the porous silicon layer is selectively oxidized to form porous silicon oxide layers 111 (hatched and dotted portions). At the same time, very thin crystalline silicon oxide layers 112 are formed at interfaces between the n-type silicon layers and the porous oxide films. The crystalline silicon oxide film 112 is obtained upon partial oxidation of an n-type silicon layer 105 and has a precise and stable structure. Therefore, a potential barrier layer formed from this structure becomes more ideal. In this manner, by changing the material of the potential barrier layer by oxidation, a quantum wire having a double barrier structure of the quantum wire 105 consisting of n-type crystalline silicon, the barrier layer 112 formed of a crystalline silicon oxide film, and a barrier layer 111 formed of a porous silicon oxide film can be formed in a surface.

The quantum wire structure obtained in this manner is stable, as in the eighth embodiment. The width of the quantum wire can be further decreased by the oxide film, thereby shortening the wavelength of light to be used.

As described above, in the method of forming the quantum wire structure of the present invention, the porous semiconductor layers are used as quantum potential barrier layers, thereby forming quantum wires or a quantum dot array. With this method, a quantum effect device having a steep quantum potential barrier to achieve a sufficient electron confinement effect can be provided, unlike the prior art which only forms a low and moderate potential barrier.

In the present invention, the p-type region is selectively converted to a porous layer to obtain a quantum potential barrier layer. For this reason, a degradation in line width controllability, which is caused by pattern transfer unavoidable in a patterning technique using a resist or mask, can be prevented. A resistless, maskless patterning process can be realized, thereby simplifying the process and largely improving the line width controllability.

In addition, since the potential barrier layer can be formed of an insulating film such as an oxide film formed at the interface between the n-type region and the porous semiconductor layer, a steeper quantum potential barrier can be realized. At this time, the width of the oxide film can be easily controlled by thermal oxidation. For this reason, the size of a quantum wire or quantum dot can be freely adjusted.

When the substrate described in the above embodiment is used, a quantum effect device such as a quantum wire superlattice, a quantum wire FET, a high electron mobility quantum wire device, and a quantum wire light-emitting device can be formed. An example will be described below.

(13th Embodiment)

Figure 24:
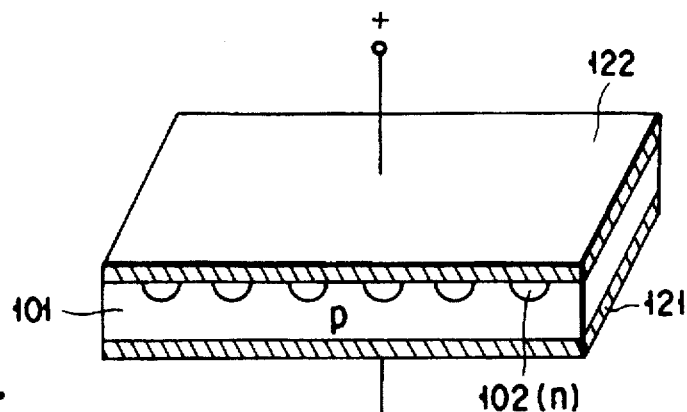
FIG. 24 is a perspective view schematically showing a quantum light-emitting element according to the 13th embodiment of the present invention.

FIG. 24 is a perspective view of a quantum effect device according to the 13th embodiment of the present invention, which relates to a quantum light-emitting element formed using the quantum wires described in the 10th embodiment.

An Al electrode 121 is formed on the lower surface of a substrate 101 shown in FIG. 20C by deposition, and a transparent electrode 122 consisting of ITO or the like is formed on its upper surface. The quantum light-emitting element obtained in this manner emits light by a heterojunction between the transparent electrode 122 and Si.

A quantum wire having a width of about 10 nm exhibits light-emitting characteristics by the quantum effect. For this reason, when a negative voltage is applied to the Al electrode 121, and a positive voltage is applied to the transparent electrode 122, a silicon-based light-emitting element can be formed.

Such a quantum light-emitting element can be applied to not only the structure of the 10th embodiment but also the structure of the seventh or eighth embodiments or the structure of the 11th or 12th embodiment.

(14th Embodiment)

Figure 25:
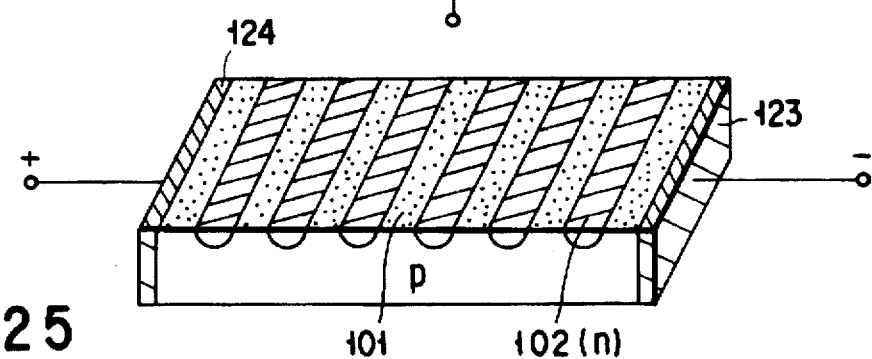
FIG. 25 is a perspective view schematically showing a resonance tunneling effect device according to the 14th embodiment of the present invention.

FIG. 25 is a perspective view of a quantum effect device according to the 14th embodiment of the present invention, which relates to a resonance tunneling effect device formed using the quantum wires described in the 10th embodiment.

A substrate shown in FIG. 20C is prepared. Al electrodes 123 and 124 are deposited on the side surfaces of a substrate 101 in a direction parallel to quantum wires 102. Ohmic contacts are formed between the substrate and the electrodes. In this manner, a mini-band is formed between multiple quantum wells formed by the multiple quantum wires. When a voltage is applied between the electrodes 123 and 124, a one-dimensional resonance tunnel effect can be realized between the quantum wires 102.

Such a quantum light-emitting element can be applied to not only the structure of the 10th embodiment but also the structure of seventh or eighth embodiment or the structure of the 11th or 12th embodiment.

(15th Embodiment)

Figure 26:
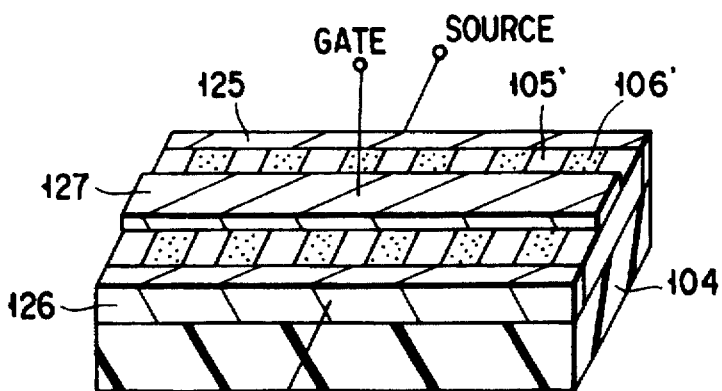
FIG. 26 is a perspective view schematically showing a quantum-coupled field effect transistor according to the 15th embodiment of the present invention.

FIG. 26 is a perspective view of a quantum effect device according to the 15th embodiment of the present invention, which relates to a quantum-coupled field effect transistor formed using the quantum wires described in the 11th embodiment.

Al is deposited at the two ends of quantum wires 105' of a substrate shown in FIG. 22C to form a source electrode 125 and a drain electrode 126.

Al is deposited to cross the plurality of quantum wires 105', thereby forming a gate electrode 127. When the gate electric field is suppressed in the quantum-coupled field effect transistor in a quantum size formed in this manner, the source-to-drain current can be controlled, and the quantum effect can be observed in the I-V characteristics.

Such a quantum-coupled field effect transistor can be applied to not only the structure of the 11th embodiment but also the structure of the 10th or 12th embodiment.

(16th Embodiment)

Figure 27:
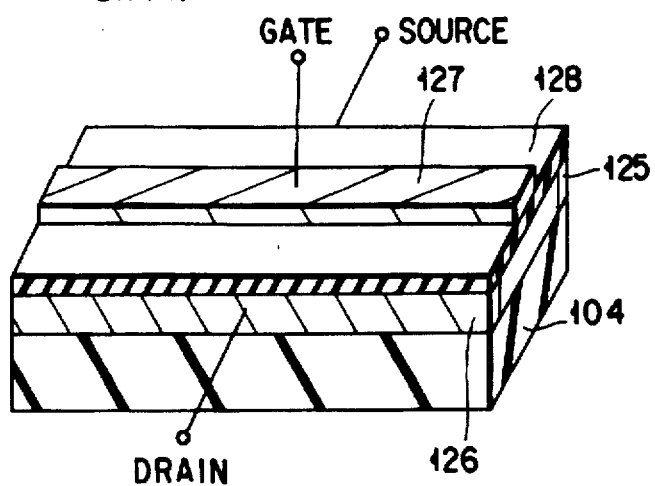
FIG. 27 is a perspective view schematically showing a quantum MOSFET according to the 16th embodiment of the present invention.

FIG. 27 is a perspective view of a quantum effect device according to the 16th embodiment of the present invention, which relates to a quantum MOSFET formed by interposing an insulating layer between a gate electrode 127 and the surface of the substrate of the transistor shown in the 15th embodiment.

Al is deposited at the two ends of quantum wires 105' of a substrate shown in FIG. 22C to form a source electrode 125 and a drain electrode 126. An SiO insulating film 128 is formed on the substrate by resistance deposition method.

An Al electrode serving as the gate electrode 127 is formed on the SiO insulating film by deposition. When a gate voltage is applied to the quantum MOSFET formed in this manner, the source-to-drain current can be controlled, and the quantum effect can be observed in the I-V characteristics.

Such a quantum MOSFET can be applied to not only the structure of the 11th embodiment but also the structure of the 10th or 12th embodiment.

(17th Embodiment)

FIGS. 28A to 28E are perspective views showing a process of manufacturing a quantum effect device according to the 17th embodiment of the present invention, which relates to an SET (Single Electron Tunneling) quantum effect device using silicon quantum dots.

Figure 28A:
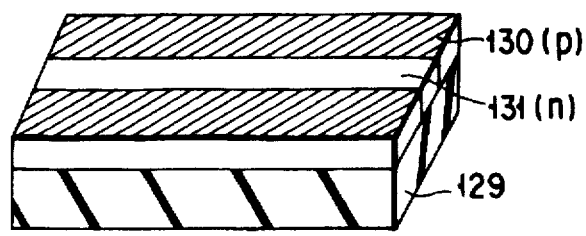
FIGS. 28A to 28E are perspective views showing a process of manufacturing an SET using silicon quantum dots according to the 17th embodiment of the present invention.
Figure 28B:
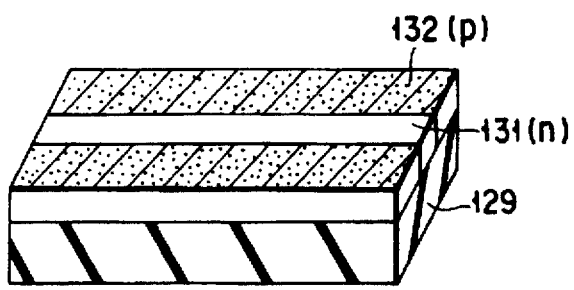

As shown in FIG. 28A, an n-type monocrystalline silicon layer having a thickness of about 10 nm is formed on an insulating $Al_2O_3$ substrate 129 by CVD under the same conditions as in the 11th embodiment. The resultant structure is doped with boron (B) by FIB ion implantation to form p-type regions 130 (hatched portions). At the same time, an n-type quantum wire 131 is formed.

Under the same conditions as in the 10th embodiment, selective anodic forming is performed to convert the p-type regions 130 to porous layers, thereby forming porous silicon layers (not shown). The formed porous silicon layers are selectively thermally oxidized under the same conditions as in the 12th embodiment to form porous silicon oxide films 132 (hatched and dotted portions in FIG. 28B).

Figure 28C:
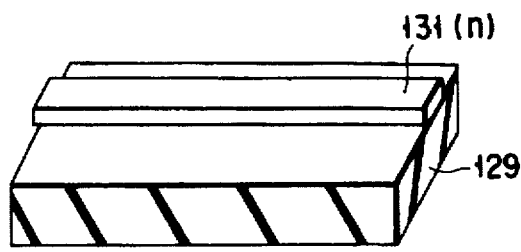

Then, as shown in FIG. 28C, the porous silicon oxide films 132 are selectively removed by a solution of hydrofluoric acid to form an n-type silicon quantum wire 131'. Selective etching is performed using a 1:10 dilute hydrofluoric acid solution of the hydrofluoric acid solution (HF 49%).

Figure 28D:
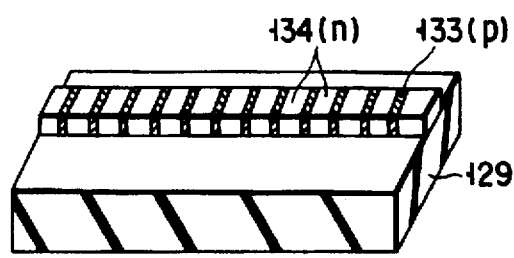
Figure 28E:
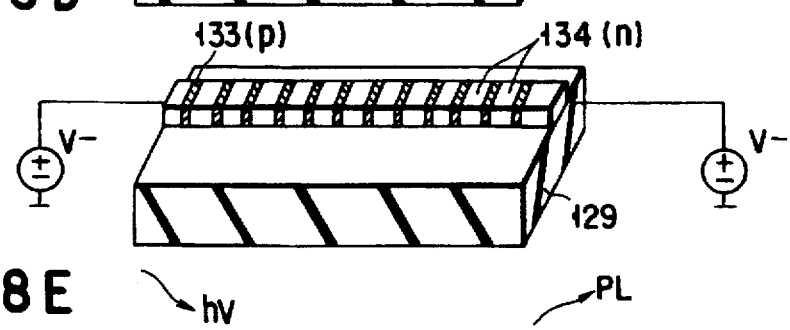

As shown in FIG. 28D, p-type wires are formed on the n-type silicon quantum wire 131' by FIB under the same conditions as in the 10th embodiment. Anodic forming of the p-type wires is performed to form potential barrier layers 133 (thickness: 3 to 5 nm) consisting of porous silicon. At the same time, the n-type silicon region which is not anodic-formed is converted to quantum dots 134. When a power supply is connected to the one-dimensional SET array having the barrier layers consisting of porous silicon formed in this manner, as shown in FIG. 28E, an SET quantum effect device can be formed.

In addition, when the above element is further thermally oxidized, a one-dimensional SET array having $SiO_2$ barrier layers at the interfaces with the quantum dots can be also be formed.

(18th Embodiment)

Figure 29:
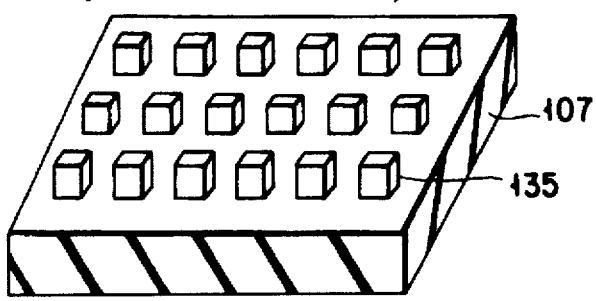
FIG. 29 is a perspective view schematically showing a zero-dimensional surface light-emitting quantum dot array according to the 18th embodiment of the present invention.

FIG. 29 is a perspective view of a quantum effect device according to the 18th embodiment of the present invention, which relates to a zero-dimensional surface light-emitting dot array formed using the quantum dots shown in FIG. 15, which has been described in the eighth embodiment.

When a porous silicon layer 113 of the quantum dot array shown in FIG. 15 is removed using a solution of hydrofluoric acid to form silicon zero-dimensional dots 135, as shown in FIG. 29.

The size of a quantum dot is 10 nm or less. When an $N_2$ laser ($\lambda=337$ nm) is incident, photoluminescence in the visible region is obtained.

Such an element exhibits photoluminescence in all surface directions upon light excitation. In this manner, a zero-dimensional surface light-emitting quantum dot array is formed.

According to the present invention, selective anodic forming and wide gap characteristics of a porous semiconductor can be used to provide a quantum effect device having very fine quantum wires or a quantum dot array and a method of manufacturing the same. The quantum effect device of the present invention uses a porous semiconductor layer as a quantum potential barrier layer, so that the device has a very steep potential barrier. When the porous semiconductor layer is selectively oxidized, a double barrier structure in which the quantum wire or dot on the substrate is surrounded by a quantum potential barrier formed of an oxide film and a quantum potential barrier formed of a porous semiconductor oxide film can be realized. For this reason, stable and precise quantum wires or quantum dots can be provided. In addition, since different barriers can be simultaneously formed in a surface, the tunneling probability can be controlled by the different barrier levels. Therefore, a silicon-based quantum effect device having a wide application range can be provided.

The accompanying drawings, which are incorporated in and constitute a part of the specification, illustrate presently preferred embodiments of the invention and, together with the general description given above and the detailed description of the preferred embodiments given below, serve to explain the principles of the invention.

What is claimed is:

1. A quantum effect device comprising:
   a first layer having a plurality of charge confinement regions that respectively confine a charged particle to be retained therein during an operational mode, a selected number of said plurality of charge confinement regions being disposed proximate to each other so as to influence energy levels thereof and relative occupations of said charged particle; and
   a second layer opposing and separated from said first layer and having a higher concentration of charged particles than said first layer.

2. A device according to claim 1, wherein said second layer is a metal layer.

3. A device according to claim 1, wherein said second layer is a semiconductor layer having charges at a high concentration.

4. A device according to claim 1, further comprising a third layer between said first layer and said second layer, wherein said charge confinement regions consist of a first semiconductor, and said third layer consists of a second semiconductor having a band gap larger than that of the first semiconductor.

5. A device according to claim 1, further comprising a third layer formed of an insulating film between said first layer and said second layer.

6. A device according to claim 1, wherein said selected number of said plurality of charge confinement regions are defined as a cell unit, and said selected number of said plurality of charge confinement regions and said first layer surrounding said selected number of said plurality of confinement regions have an energy band structure supporting no more than two carriers in said cell.

7. A device according to claim 1, wherein said first layer consists of a third semiconductor, and a combination of the first semiconductor and the third semiconductor is selected from the group consisting of GaAs/AlGaAs, InGaAs/AlInAs, InGaAs/InP, and InGaAs/GaInSb.

8. A device according to claim 1, wherein a first semiconductor forming said charge confinement regions is silicon, and said first layer containing said charge confinement regions is formed of porous silicon.

9. A device according to claim 1, wherein a first semiconductor forming said charge confinement regions is silicon, said first layer containing said charge confinement regions is a porous silicon oxide film, and a crystalline silicon oxide film is formed at an interface between said confinement region and said first layer.

10. A device according to claim 2, wherein a metal used for said second layer has a screening length smaller than a diameter of said charge confinement region, and the screening length is expressed as $(6\pi e^2 n/EF)^{1/2}$ where n is an electron concentration, and EF is a Fermi energy.

11. A quantum effect device comprising:

a first layer having a plurality of charge confinement regions that respectively confine a charged particle to be retained therein during an operational mode, a selected number of said plurality of charge confinement regions being disposed proximate to each other so as to influence energy levels thereof and relative occupations of said charged particle; and a second layer opposing and separated from said first layer and having a second charge as a mirror of a first charge in respective of said charge confinement regions, which has a polarity opposite to that of the first charge.

12. A device according to claim 11, wherein said selected number of said plurality of charge confinement regions are defined as a cell unit, and said selected number of said plurality of charge confinement regions and said first layer surrounding said selected number of said confinement regions have an energy band structure supporting no more than two carriers in said cell.

13. A quantum effect device comprising:

a substrate having movable charges;

a first layer which is formed on said substrate, and in which movement of charges is substantially suppressed;

a plurality of cells formed in a matrix on said first layer, said plurality of cells forming a second layer and each having a first confinement region and a second confinement region formed therein and disposed proximate to each other so as to influence energy levels thereof and relative charge occupations, at least one of said first confinement region and said second confinement region being formed of a first semiconductor and configured to assume respective polarized binary states in correspondence with a respective presence and absence of charges;

a plurality of bit lines insulatively formed on said plurality of cells, respective of said plurality of bit lines being coupled to respective of said first confinement region of said plurality of cells arranged in a column direction; and a plurality of word lines insulatively formed on said plurality of cells, respective of said plurality of word lines being coupled to respective of said second confinement region of said plurality of cells arranged in a row direction.

14. A device according to claim 13, wherein said substrate having the movable charges is disposed proximate said second layer so as to form a mirror image with a polarity opposite to the charges confined in at least one said first charge confinement region and said second charge confinement region in correspondence therewith, respectively.

15. A device according to claim 13, wherein each of said plurality of bit lines is connected to a first conductor at a portion adjacent to said first charge confinement region, the first conductor disposed close to said first confinement region and insulated therefrom.

16. A device according to claim 13, wherein each of said plurality of word lines is connected to a second conductor at a portion adjacent to said second confinement region, the second conductor disposed close to said second confinement region and insulated therefrom.

17. A device according to claim 13, wherein said substrate is formed of a metal.

18. A device according to claim 13, wherein said substrate is formed of a semiconductor having charges at a high concentration.

19. A device according to claim 13, wherein said first layer is formed of a second semiconductor having a band gap larger than that of the first semiconductor.

20. A device according to claim 13, wherein said first layer is formed of an insulating layer.

* * * * *